(12) United States Patent
Cui et al.

(10) Patent No.: US 12,000,875 B1
(45) Date of Patent: Jun. 4, 2024

(54) INTELLIGENT ELECTRONIC DEVICE AND METHOD THEREOF

(71) Applicant: Accuenergy (Canada) Inc., Toronto (CA)

(72) Inventors: Shaohang Cui, Toronto (CA); Ketao Li, Toronto (CA); Yufan Wang, Toronto (CA); Liang Wang, Toronto (CA)

(73) Assignee: Accuenergy (Canada) Inc., Toronto (CA)

( * ) Notice: Subject to any disclaimer, the term of this patent is extended or adjusted under 35 U.S.C. 154(b) by 0 days.

(21) Appl. No.: 18/075,380

(22) Filed: Dec. 5, 2022

(51) Int. Cl.
*G01R 22/10* (2006.01)
*H04L 67/12* (2022.01)

(52) U.S. Cl.
CPC .............. *G01R 22/10* (2013.01); *H04L 67/12* (2013.01)

(58) Field of Classification Search
CPC ........... H04Q 2209/00; H04Q 2209/10; H04Q 2209/40; H04Q 2209/60; H04Q 2209/80; H04Q 2209/84; H04Q 9/00; H04L 67/12; G01R 22/00; G01R 22/10; G01D 4/00; G01D 4/002; G01D 4/004
See application file for complete search history.

(56) References Cited

U.S. PATENT DOCUMENTS

| | | | |
|---|---|---|---|
| 10,474,591 B2 * | 11/2019 | Kagan | ................ G01R 19/2513 |
| 2015/0381737 A1 * | 12/2015 | Quinn | ..................... H04L 67/12 709/217 |

* cited by examiner

*Primary Examiner* — Franklin D Balseca
(74) *Attorney, Agent, or Firm* — Michael D. Eisenberg (57) ABSTRACT

Provided are a method and apparatus for generating an electrical parameter identifier in an Intelligent Electronic Device (IED). Specifically, the method includes obtaining attributes of the electrical parameter and generating an identifier for the electrical parameter according to the attributes.

6 Claims, 9 Drawing Sheets

| parameter group | parameter type | update rate | channel type | channel identification |
|---|---|---|---|---|

INTELLIGENT ELECTRONIC DEVICE AND METHOD THEREOF

FIELD OF THE INVENTION

The present disclosure generally relates to the field of Intelligent Electronic Devices for electrical utility services and, more specifically, to digital electrical power and energy meters for use in performing electrical utility services.

BACKGROUND

Monitoring electrical energy is a fundamental function within any electrical power distribution system. Electrical energy may be monitored to determine usage and power quality. A device that monitors electrical energy may be an Intelligent Electronic Device (IED).

Thousands of electrical parameters are used to present the performance index of the electrical power distribution system. Standard practice would be to list all the electrical parameters one by one and assign the increment identifier. With the increasingly massive number of electrical parameters, it is difficult to simply assign an electrical parameter identifier for it all, which would be time-consuming, hardly extendable, and less maintainable.

Therefore, a method to generate electrical parameter identifier is needed.

SUMMARY OF THE INVENTION

The embodiments of the present disclosure generally related to method and apparatus for generating an electrical parameter identifier in an IED.

In some other embodiments, the present disclosure provides a method of generating an identifier for an electrical parameter measured by an IED. The method includes obtaining attributes of the electrical parameter and generating an identifier for the electrical parameter according to the attributes.

In some embodiments, the present disclosure provides an IED. The IED includes at least one sensor configured for sensing at least one electrical parameter of electrical power distributed from an electrical distribution system to a load. The IED also includes at least one analog-to-digital converter coupled to the at least one sensor and configured for converting an analog signal output from the at least one sensor to digital data. The IED further includes a DSP (Digital Signal Processor) coupled to the at least one analog-to-digital converter, and configured to perform digital signal processing on the signal from the at least one analog-to-digital converter. The IED further includes a CPU coupled to the DSP via a hardware path, wherein the DSP and the CPU are configured to communicate using a transmission protocol including a data header and a data payload based on the hardware path; wherein the data header includes a field of parameter group, the data payload includes fields of a parameter type, an update rate and a channel type; the parameter group represents a group of electrical parameters with the similar functions; the parameter type represents specific type of the parameter group; the update rate represents a period between times of current electrical parameters measured by IED and the next electrical parameters measured by IED; the channel type represents the specific channel where the electrical parameter is measured.

These and other features and aspects of the present disclosure will become fully apparent from the following detailed description of exemplary embodiments, the appended claims and the accompanying drawings.

DETAILED DESCRIPTION

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
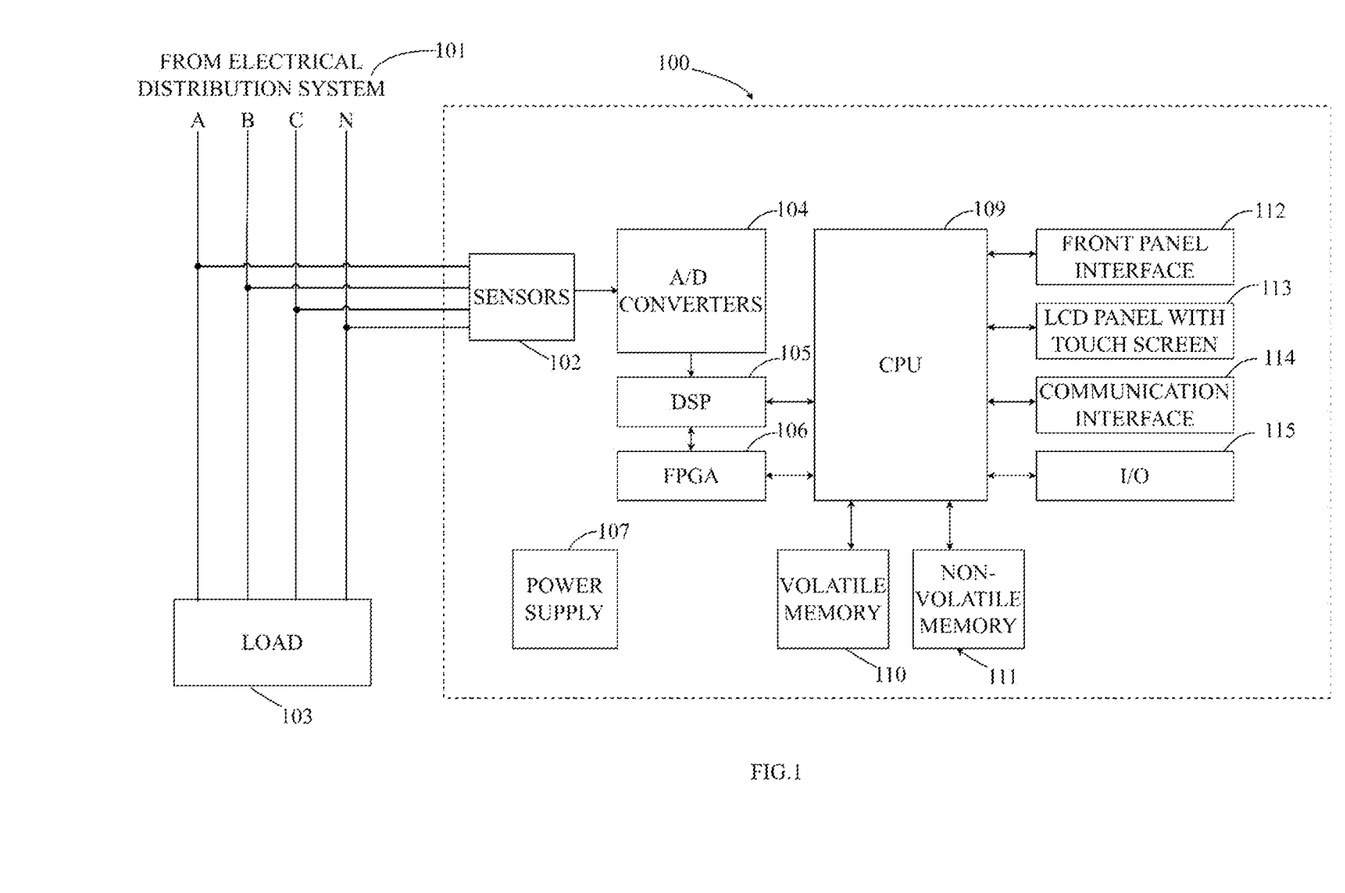
FIG. 1 is a block diagram of an example Intelligent Electronic Device according to some embodiments.

FIG. 1 is a block diagram of an Intelligent Electronic Device (IED) 100 for monitoring power usage and power quality for any metered point within an electrical distribution system 101.

The IED 100 illustrated in FIG. 1 includes multiple sensors 102 coupled with various phases A, B, C, and N (neutral) of an electrical distribution system 101, multiple analog-to-digital (A/D) converters 104, a power supply 107, volatile memory 110, non-volatile memory 111, a front panel interface 112, and a processing module that includes at least one Central Processing Unit (CPU) and/or one or more Digital Signal Processors (DSP), two of which are shown DSP 105 and CPU 109. The IED 100 also includes a Field Programmable Gate Array (FPGA) 106 which performs several functions, including acting as a communications bridge for transferring data between the various processors (105 and 109).

The sensors 102 sense electrical parameters, such as voltage and current, on incoming lines (phase A, phase B, phase C, and neutral N) of an electrical power distribution system 101 that are coupled to at least one load 103 that consumes the provided power. In one embodiment, the sensors 102 include current transformers and potential transformers, where one current transformer and one voltage transformer will be coupled to each phase of the incoming power lines. The primary winding of each transformer will be coupled to the incoming power lines and the secondary winding of each transformer will output a voltage representative of the sensed voltage and current. The output of each transformer will be coupled with the A/D converters 104 which are configured to convert the analog voltage output from the transformer to a digital signal that can be processed by the DSP 105.

In some embodiments, digital signal of DSP 105 is transmitted to a gate array, such as Field Programmable Gate Array (FPGA) 106. The digital signal is then transmitted from the FPGA 106 to the CPU 109.

The CPU 109 or DSP Processors 105 are configured to receive digital signals from the A/D converters 104 and perform the necessary calculations to determine power usage and control the overall operations of the IED 100. In some embodiments, the CPU 109 and DSP 105 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 106. In some embodiments, the digital samples, which are output from the A/D converters 104 are sent directly to the CPU 109, effectively bypassing the DSP 105 and the FPGA 106 as a communications gateway.

The power supply 107 provides power to each component of the IED 100. In one embodiment, the power supply 107 is a transformer with its primary windings coupled to the incoming power distribution lines to provide a nominal voltage at its secondary windings. In other embodiments, power may be supplied from an independent power source to the power supply 107.

In FIG. 1, the front panel interface 112 is shown coupled to the CPU 109 which includes indicators, switches, and various inputs.

In FIG. 1, the LCD panel with touchscreen 113 is shown coupled to the CPU 150 for interacting with a user and for communicating events, such as alarms and instructions. The LCD panel with touchscreen 113 may provide information to the user in the form of alpha-numeric lines, computer-generated graphics, videos, animations, etc.

An input/output (I/O) interface 115 may be provided for receiving externally generated inputs from the IED 100 and for outputting data, such as serial data, to other devices. In one embodiment, the I/O interface 115 may include a connector for receiving various cards and/or modules that increase and/or change the functionality of the IED 100.

The IED 100 also includes volatile memory 110 and non-volatile memory 111. The volatile memory 110 will store the sensed and generated data for further processing and for retrieval when requested to be displayed at the IED 100 or from a remote location. The volatile memory 110 includes internal storage memory, such as Random-Access Memory (RAM). The non-volatile memory 111 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including timestamps), and stored digital samples for later download to a client application, webserver, or PC application.

In a further embodiment, the IED 100 will include a communication interface 114, also know as a network interface, for enabling communications between the IED, or meter, and a remote terminal unit or programmable logic controller and other computing devices, microprocessors, desktop computers, laptop computers, other meter modules, etc. The communication interface 114 may be a modem, Network Interface Card (NIC), wireless transceiver, or other interface. The communication interface 114 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The IED 100 may communicate to a server or other computing device via the communication interface 114. The IED 100 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the IED 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 109 to compute other electrical parameters such as harmonics, magnitudes, symmetrical components, and phasor analysis.

In a further embodiment, the IED 100 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which IED firmware and/or software can be upgraded. An event command can be issued by a user, on a schedule, or through a digital communication that will trigger the IED 100 to access a remote server and obtain the new program code. This will ensure that program data will be maintained, assuring the user that all information is displayed identically on all units.

It is to be understood that the present disclosure may be implemented in various forms of hardware, software, firmware, special purpose processors, or a combination thereof. The IED 100 also includes an operating system and application programs. The various processes and functions described herein may either be part of an application program (or a combination thereof) which is executed via the operating system.

Because some of the system components and methods depicted in the accompanying figures may be implemented using either software or firmware, it is to be further understood that the actual connections between the system components (or the process steps) may differ depending on the specific way the present disclosure is programmed. Given the teachings of the present disclosure provided herein, one of ordinary skill in the related art will be able to contemplate these and similar implementations or configurations of the present disclosure.

Figure 2:
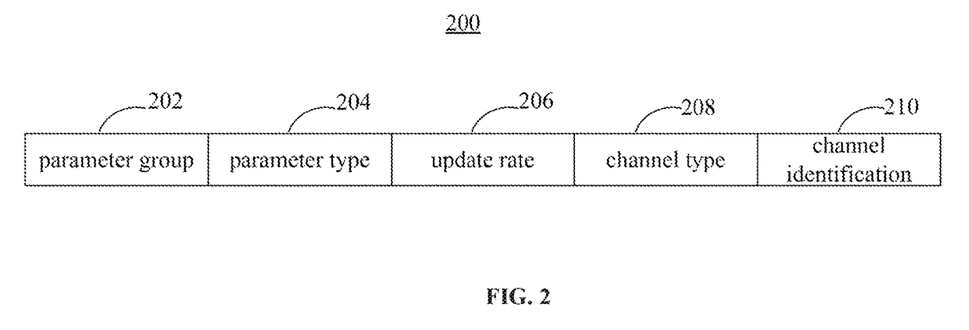
FIG. 2 is an example structure of the electrical parameter identifier according to some embodiments.

There are tens of thousands of electrical parameters measured by IED 100. Each of them needs a unique parameter identifier for differentiation. The disclosure presents a method to generate a unique identifier for each electrical parameter in IED 100. FIG. 2 is an example structure of the electrical parameter identifier according to some embodiments. The electrical parameter identifier includes a parameter group 202, a parameter type 204, an update rate 206, a channel type 208 and a channel identification 210. In some embodiments, the electrical parameter identifier may be numeric data type such as an integer stored in volatile memory 110. In some embodiments, the electrical parameter identifier may be a string including a sequence of characters stored in volatile memory 110.

Figure 3:
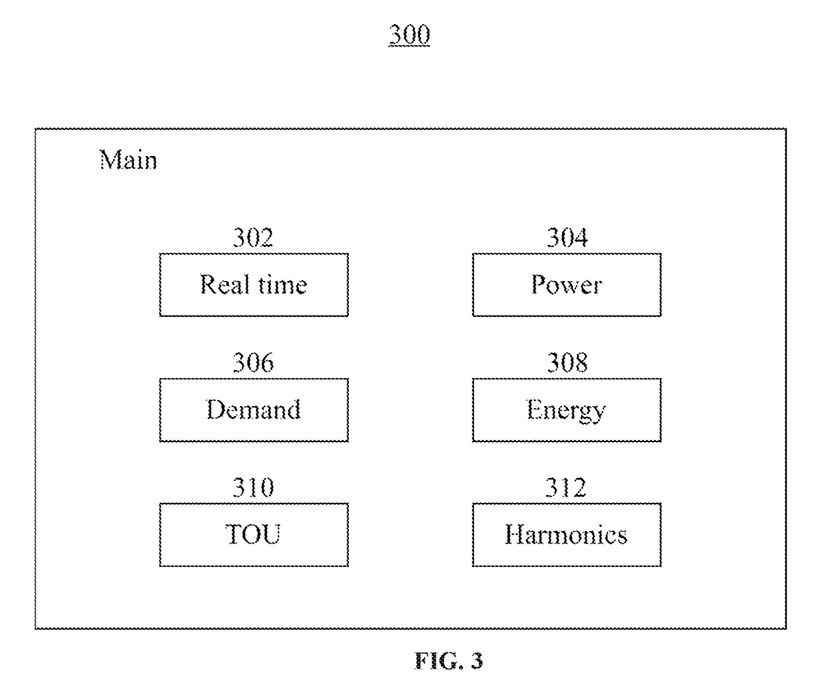
FIG. 3 is an example user interface including some parameter groups according to some embodiments.

The parameter group 202 represents a group of electrical parameters with the similar functions. Users of IED 100 may tend to visit a group of electrical parameters together. FIG. 3 is an example user interface including some parameter groups according to some embodiments. The user interface 300 may be displayed on the touch screen 113. There are some electrical parameter groups such as real time group 302, power group 304, demand group 306, energy group 308, TOU group 310 and harmonics group 312.

The real time group 302 includes some important base electrical parameters that reflect the performance index of electrical distribution system 101. The other electrical parameters measured by IED 100 may be dependent on these base electrical parameters.

Figure 4:
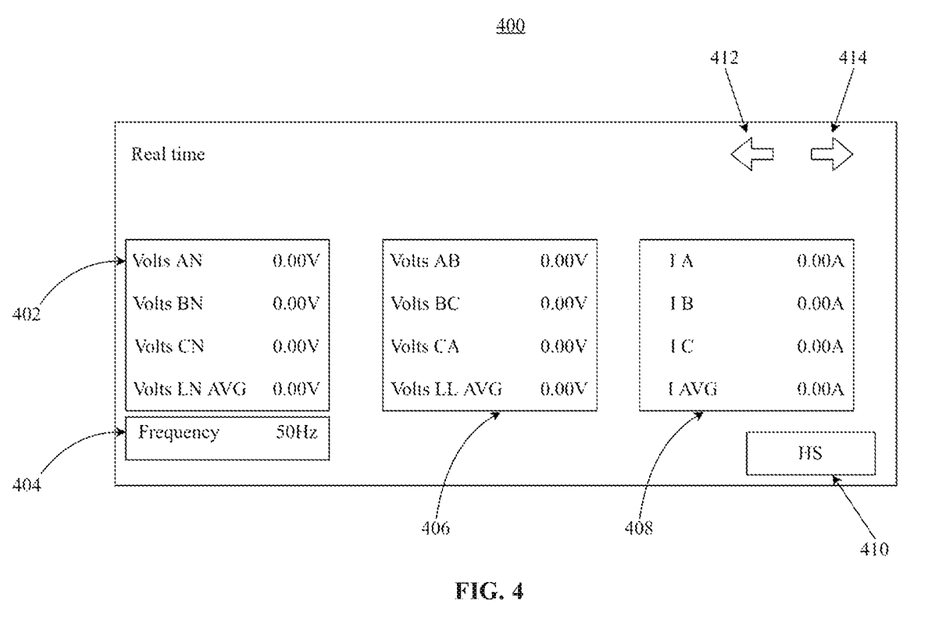
FIG. 4 is an example user interface illustrating parameter types of real time group.

The parameter type 204 represents specific type of each parameter group 202. FIG. 4 is an example user interface 400 illustrating parameter types of real time group 302. The user interface 400 may be displayed on the touch screen 113. The user interface 400 may appear after a user taps real time button 302 on the user interface 300. The real time group includes parameter types such as line to neutral voltages 402, frequency 404, line to line voltage 406, and line current 408.

The update rate 206 represents a period between times of current electrical parameters measured by IED 100 and the next electrical parameters measured by IED 100. According to IEC 61000-4-30, the update rate 206 can be listed in the table below.

TABLE 1 example update rate of electrical parameters

| item | Update rate |
| --- | --- |
| 0 | HS (one cycle) |
| 1 | 10/12 cycle |
| 2 | 3 seconds |
| 3 | 10 minutes |
| 4 | 2 hours |

The channel type 208 represents the specific channel where an electrical parameter is measured. For example, in the line to neutral voltages 402, "Volts AN" is a channel representing the voltage between line A and the neutral, "Volts LN AVG" is another channel representing the average value of Volts AN, Volts BN and Volts CA.

In FIG. 4, HS 410 indicates that all the electrical parameters shown in the user interface 400 are parameter values updated every cycle. Users can press forward button 414 or backward button 412 to observe the parameter values measured with other update rates such as 3 seconds, 10 minutes or 2 hours, etc.

All the information regarding parameter type, update rate, channel type in real time group 302 is listed in table 2 as below. In table 2, each field is represented by a number before the colon. For example, parameter type frequency is represented by 0.

TABLE 2 example identifiers for electrical parameters in real time group

| Parameter group | Parameter type | Update rate | Channel type |
| --- | --- | --- | --- |
| 0: real time group | 0: Frequency | 0: HS | 0: total |
| | 1: Line-to-Neutral Voltage | 1: 10/12 cycle | 1: average |
| | 2: Line-to-Line Voltage | 2: 3 seconds | 2: phase A to Neutral/phase A to phase B |
| | 3: Line Current | 3: 10 minutes | 3: phase B to Neutral/phase B to phase C |
| | | 4: 2 hours | 4: phase C to Neutral/phase C to phase A |
| | | | 5: Neutral |

The channel identification 210 is an optional field, which represents the more detailed channel information. For example, in harmonics 312, the channel identification can be used to represent a specific harmonics order. All the information regarding parameter type, update rate, channel type in harmonics group 312 is listed as below.

TABLE 3 example identifiers for electrical parameters in harmonics group

| Parameter group | Parameter type | Update rate | Channel type | Channel identification |
|---|---|---|---|---|
| 5: Harmonics group | 0: harmonics voltage magnitude<br>1: harmonics current magnitude<br>2: harmonics voltage angle<br>3: harmonics current angle | 0: 10/12 cycle<br>1: 3 seconds<br>2: 10 minutes<br>3: 2 hours | 0: phase A<br>1: phase B<br>2: phase C<br>3: phase A | 1-127: harmonics order |

The power group 304 includes different power values measured by IED 100. All the information regarding parameter type, update rate, channel type in power group 304 is listed as below.

TABLE 4 example identifiers for electrical parameters in power group

| Parameter group | Parameter type | Update rate | Channel type |
|---|---|---|---|
| 1: Power group | 0: active power<br>1: reactive power<br>2: apparent power | 0: HS<br>1: 10/12 cycle<br>2: 3 seconds<br>3: 10 minutes<br>4: 2 hours | 0: total<br>1: average<br>2: phase A<br>3: phase B<br>4: phase C |

The demand group 306 includes different demand values measured by IED 100. All the information regarding parameter type, update rate, channel type in power group 306 is listed as below.

TABLE 5 example identifiers for electrical parameters in demand group

| Parameter group | Parameter type | Update rate | Channel type |
|---|---|---|---|
| 1: demand group | 0: active power<br>1: current demand<br>2: active power demand<br>3: reactive power demand<br>4: apparent power demand | N/A | 0: total<br>1: average<br>2: phase A<br>3: phase B<br>4: phase C |

The energy group 308 includes different accumulated energy values measured by IED 100. All the information regarding parameter type, update rate, channel type in energy group 308 is listed as below.

TABLE 6 example identifiers for electrical parameters in energy group

| Parameter group | Parameter type | Update rate | Channel type |
|---|---|---|---|
| 1: energy group | 0: active energy<br>1: reactive energy<br>2: apparent energy | 0: N/A | 0: total<br>1: average<br>2: phase A |

TABLE 6-continued example identifiers for electrical parameters in energy group

| Parameter group | Parameter type | Update rate | Channel type |
|---|---|---|---|
| | | | 3: phase B<br>4: phase C |

The TOU (Time of Use) group 308 includes different TOU values measured by IED 100. TOU is the segregation of energy rates based on the time in which the energy is being consumed. All the information regarding parameter type, update rate, channel type in energy group 310 is listed as below.

TABLE 7 example identifiers for electrical parameters in TOU group

| Parameter group | Parameter type | Update rate | Channel type |
|---|---|---|---|
| 4: TOU group | 0: TOU Import Active Energy<br>1: TOU Import Reactive Energy<br>2: TOU Apparent Energy | 0: N/A | 0: total |

It should be recognized that the information in Table 2~Table 7 can be kept in volatile memory 110 or non-volatile memory 111. Applications running in IED 100 can retrieve the information from these tables.

Figure 5:
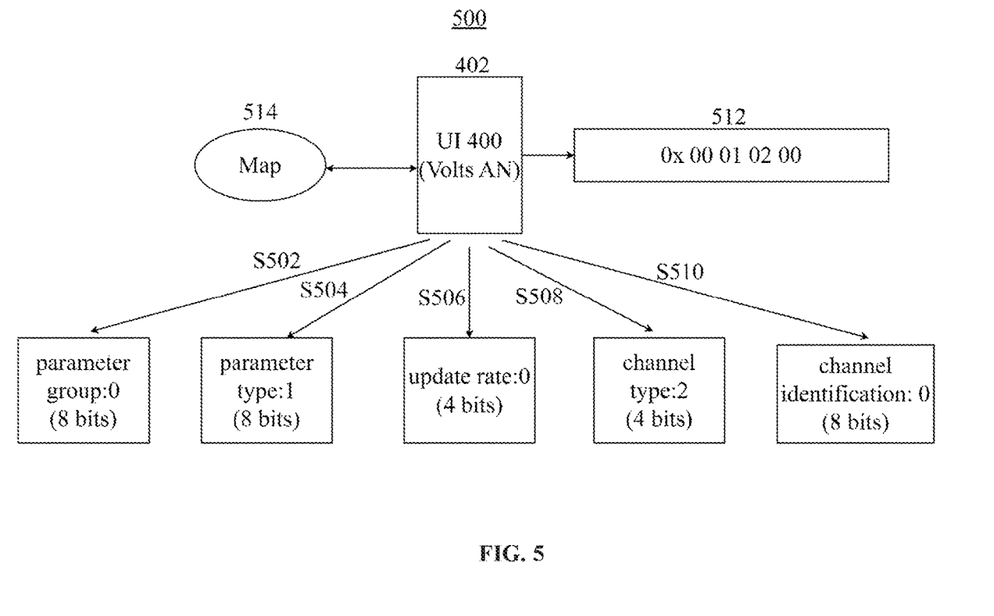
FIG. 5 is an example schematic diagram illustrating how an electrical parameter identifier is generated.

FIG. 5 is an example schematic diagram illustrating how an electrical parameter identifier is generated. Volts AN (voltage between phase A and Neutral) in 402 can obtain an identifier by getting the parameter group value 0 (S502), getting parameter type value 1 (S504), getting update rate value 0 (S506), getting channel type value 2 (S508) from table 2. Since channel identification is not applicable in the real time group, the value of channel identification can be assigned to 0 (S510). Then an electrical parameter identifier 512 of parameter Volts AN is generated. UI 400 can use this electrical parameter identifier to get the real time value of Volts AN from map 514 which stores key-value pairs. Map 514 is a map data structure in computer science, which will be discussed in FIG. 6. Finally, the value of Volts AN can be displayed in the UI 400. In some embodiments, parameter group occupies 8 bits, parameter type occupies 8 bits, update rate occupies 4 bits, channel type occupies 4 bits and channel identification occupies 8 bits.

Figure 6:
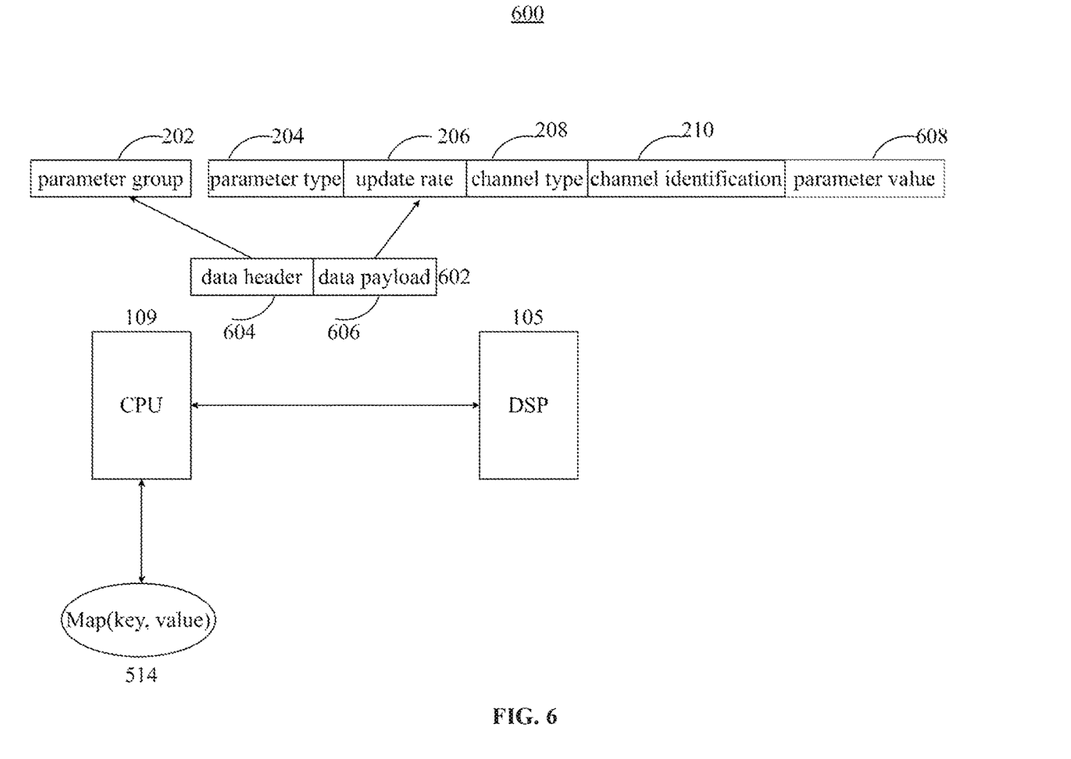
FIG. 6 is an example schematic diagram illustrating how a key-value data structure storing parameter identifier and electrical parameter value is operated.

FIG. 6 is an example schematic diagram illustrating how a key-value data structure storing parameter identifier and electrical parameter value is operated. In IED 100, DSP 105 is responsible for processing the signal from ADC 104 and obtaining various electrical parameters such as RMS (Root Mean Square) voltage, energy, harmonic, frequency. CPU 109 runs some applications such as user interface. The communication interface between CPU 109 and DSP 105 may be an SPI (Serial Peripheral Interface). In one embodiment, CPU 109 is a master device which controls a chip/slave select signal and a serial clock signal. DSP 105 is a slave device which receives and transmits data when the serial clock signal is active.

In order to make the communication between CPU 109 and DSP 105 more efficient and manageable, a transmission protocol is used between CPU 109 and DSP 105. Each packet 602 of the transmission protocol includes a data head 604 and a data payload 606. The data header 602 includes parameter group 202. The data payload 606 includes parameter type 204, update rate 206, channel type 208 and channel identification 210. The data payload 606 also includes the value of electrical parameter represented by an identifier including the parameter group 202 in data header 604, and parameter type 204, update rate 206, channel type 208, channel identification 210 in the data payload 606.

After a packet 602 is generated by the DSP 105, the packet 602 will be sent from DSP 105 to CPU 109 through SPI. CPU 109 starts to parse the packet 602 after CPU 109 receives the packet from DSP 105. CPU 109 will generate an electrical parameter identifier using the parameter group 202, parameter type 204, update rate 206, channel type 208, channel identification 210 in the packet according to the method shown in FIG. 5. CPU 109 will also get the electrical parameter value 608. Then CPU 109 will store the electrical parameter value 608 as value and the electrical parameter identification number as key in map 514, which stores key-value pairs.

Figure 7:
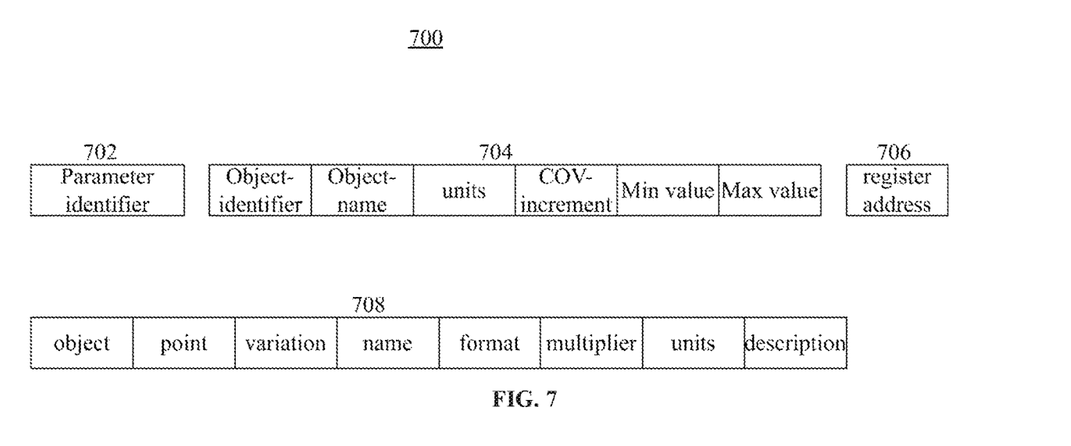
FIG. 7 is a mapping table according to some embodiments.

IED 100 may support several different protocols over Ethernet and serial connections of communication interface 114. FIG. 7 illustrates a mapping table 700 including fields of the electrical parameter identifier 702 and the corresponding information required by different protocols such as BACnet service information 704, Modbus service information 706, DNP service information 708, which will be discussed in the following. It should be recognized that table 700 may include more protocols including the current protocols and the future protocols. Every row in table 700 records a parameter identifier and its corresponding service information of different protocols. Table 700 may be stored as a separate file or as part of database. In some embodiments, table 700 is stored in volatile memory 110. In some embodiments, table 700 is stored in non-volatile memory 111 as a configuration file. The users of IED 100 can customize table 700 to support different protocols in IED 100.

Modbus is an industrial protocol standard. Modbus protocol is defined as a master/slave protocol where the master initiates transactions and the slave(s) respond with the requested information or action. Modbus commands can instruct a Modbus device to change the value in one of its registers, that is written to coil and holding registers, or command the device to send back one or more values contained in its coil and holding registers. In IED 100, each electrical parameter value is stored in a holding register with a register address 706. If IED 100 works as Modbus slave device, Modbus master device can read each electrical parameter value according to the corresponding register address.

Figure 8:
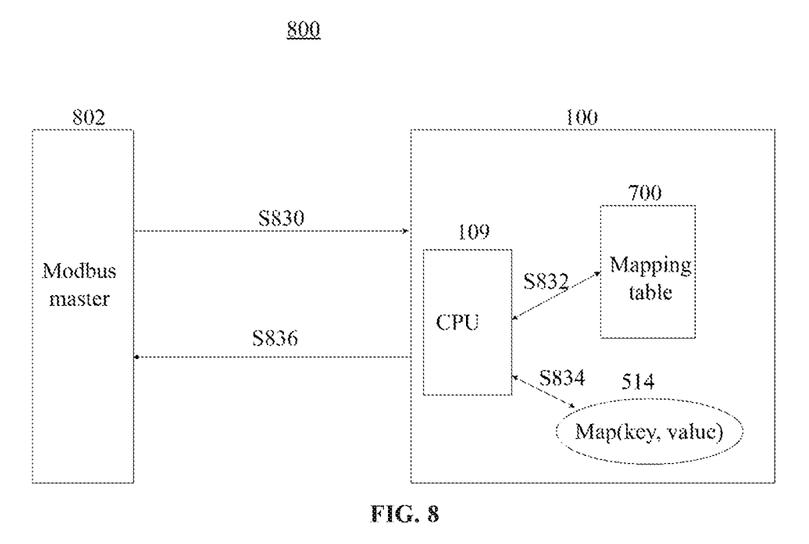
FIG. 8 is an example schematic diagram illustrating a process that a Modbus master device communicate with a Modbus slave device according to some embodiments.

FIG. 8 is an example schematic diagram illustrating a process that a Modbus master device communicate with a Modbus slave device according to some embodiments. In step S830, Modbus master device 802 sends a message to IED 100 (Modbus slave device), inquiring the information stored in a specific Modbus register address in IED 100. In step S832, CPU 109 translates the Modbus register address into a parameter identifier according to mapping table 700 In step S834, CPU 109 obtains the corresponding electrical parameter value from map 514 according to the parameter identifier. In step S836, CPU 109 sends the information stored in a specific Modbus register address in IED 100 to Modbus master device 802.

BACnet is a communication protocol for Building Automation and Control (BAC) networks that the ASHRAE, ANSI, and ISO 16485-5 standards protocol. BACnet was designed to allow communication of building automation and control systems for applications such as heating, ventilating, and air-conditioning control, light control, access control, and fire detection systems and their associated equipment. The BACnet protocol provides mechanisms for computerized building automation devices to exchange information, regardless of the particular building service they perform.

IED 100 may embed BACnet IP communication stack and may also embed BACnet MS/TP communication stack. It communicates in native BACnet IP over Ethernet to seamlessly integrate with most building automation/control system and communicating with the BACnet MS/TP via the RS485. IED 100 has some predefined BACnet objects to store the electrical parameters measured by IED 100.

TABLE 8 an example BACnet object

| Object-identifier | Object name | units | COV-increment | Min value | Max value |
|---|---|---|---|---|---|
| Analog input 1 | Line 1 Line-Neutral Voltage | volts | 1 | 0 | 100000 |

Figure 9:
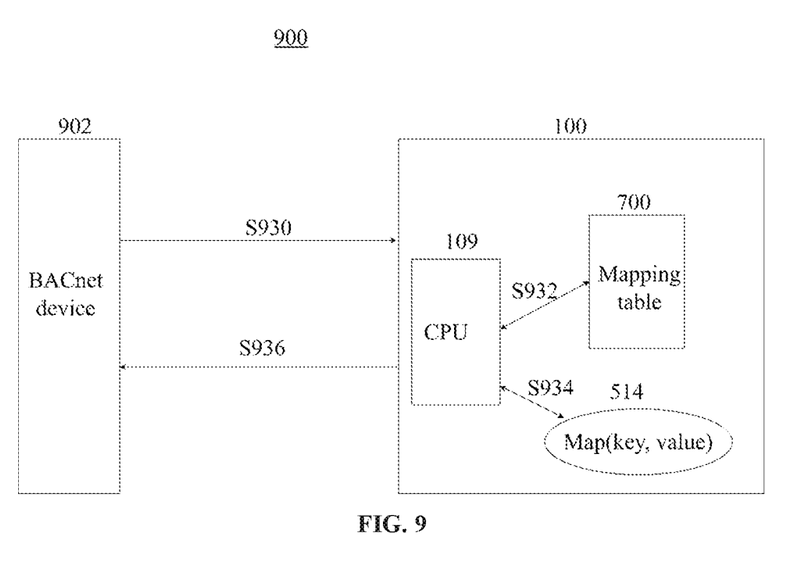
FIG. 9 is an example schematic diagram illustrating a process that a BACnet device communicate with another BACnet device according to some embodiments.

FIG. 9 is an example schematic diagram illustrating a process that a BACnet device communicate with another BACnet device according to some embodiments. In step S930, BACnet device 902 sends a message to IED 100 (BACnet device), inquiring a value corresponding to a BACnet object in IED 100. In step S932, CPU 109 translates the BACnet object into a parameter identifier according to mapping table 700. In step S934, CPU 109 obtains the corresponding electrical parameter value from map 514 according to the parameter identifier. In step S936, CPU 109 sends the value corresponding to a BACnet object in IED 100 to BACnet device 802.

Distributed Network Protocol 3 (DNP3) is a set of communications protocols used between components in process automation systems. Its main use is in utilities such as electric and water companies. It was developed for communications between various types of data acquisition and control equipment. It plays a crucial role in SCADA systems, where it is used by SCADA Master Stations (a.k.a. Control Centers), Remote Terminal Units (RTUs), and Intelligent Electronic Devices (IEDs). It is primarily used for communications between a master station and RTUs or IEDs.

The following table describes one example DNP3 data objects.

TABLE 9 example DNP3 data objects

| object | Point | Variation | Name | Format | Multiplier | Units | description |
|---|---|---|---|---|---|---|---|
| 100 | 0 | 1 | Freq_rms | float | 1.0 | Hz | Frequency |
| 100 | 1 | 1 | Ua_rms | Float | 1.0 | V | Voltage A |
| 100 | 2 | 1 | Ub_rms | Float | 1.0 | V | Voltage B |
| 100 | 3 | 1 | Uc_rms | float | 1.0 | V | Voltage C |

Figure 10:
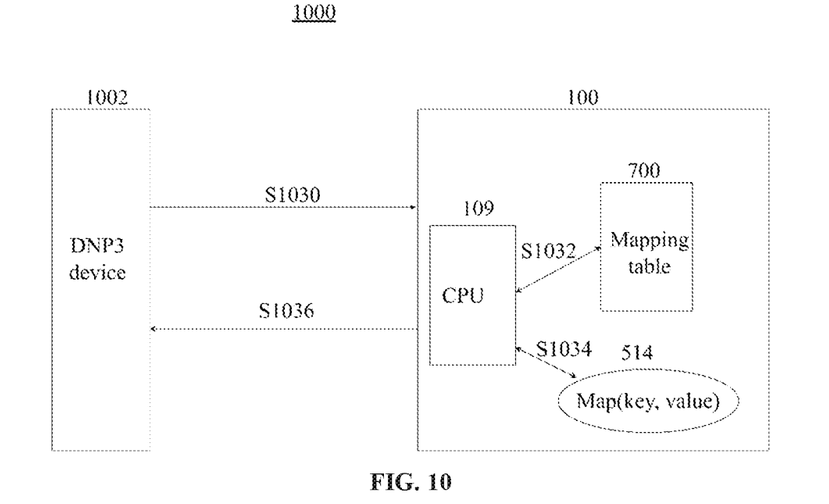
FIG. 10 is an example schematic diagram illustrating a process that a DNP3 device communicate with a DNP3 device according to some embodiments.

FIG. 10 is an example schematic diagram illustrating a process that a DNP3 device communicate with a DNP3 device according to some embodiments. In step S1030, DNP3 device 1002 sends a message to IED 100 (DNP3 device), inquiring a value corresponding to a DNP3 data object in IED 100. In step S1032, CPU 109 translates the DNP3 data object into a parameter identifier according to mapping table 700. In step S1034, CPU 109 obtains the corresponding electrical parameter value from map 514 according to the parameter identifier. In step S1036, CPU 109 sends the value corresponding to the DNP3 data object in IED 100 to DNP3 device 1002.

The mapping table 700 can be customized by users to support the different protocols in IED 100.

Embodiments of the teachings of the present disclosure have been described in an illustrative manner. It is to be understood that the terminology, which has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. A method of generating an identifier for an electrical parameter measured by an IED, the method comprising:
   obtaining attributes of the electrical parameter; and
   generating an identifier for the electrical parameter according to the attributes;
   wherein the attributes of the electrical parameter comprise:
      a parameter group representing a group of electrical parameters with similar functions;
      a parameter type representing specific type of the parameter group;
      an update rate representing a period between times of current electrical parameters measured by the IED and next electrical parameters measured by the IED; and
      a channel type representing a specific channel where the electrical parameter is measured.

2. The method of claim 1, where the attributes of the electrical parameter further comprise channel identification representing a specific harmonics order for harmonics measurement.

3. An intelligent electronic device (IED) comprising:
   at least one sensor configured for sensing at least one electrical parameter of electrical power distributed from an electrical distribution system to a load;
   at least one analog-to-digital converter coupled to the at least one sensor and configured for converting an analog signal output from the at least one sensor to digital data;
   a DSP (Digital Signal Processor) coupled to the at least one analog-to-digital converter, and configured to perform digital signal processing on the digital data from the at least one analog-to-digital converter; and
   a CPU coupled to the DSP via a hardware path;
   wherein the DSP and the CPU are configured to communicate using a transmission protocol including a data header and a data payload based on the hardware path; and
   wherein the data header includes a field of parameter group, the data payload includes fields of a parameter type, an update rate and a channel type; the parameter group represents a group of electrical parameters with similar functions; the parameter type represents specific type of the parameter group; the update rate represents a period between times of current electrical parameters measured by the IED and next electrical parameters measured by the IED; the channel type represents a specific channel where the electrical parameter is measured.

4. The IED of claim 3, wherein the CPU communicates with the DSP on a dedicated hardware bus.

5. The IED of claim 4, where the dedicated hardware bus uses serial transmission.

6. The IED of claim 4, where the dedicated hardware bus uses a transmission protocol supported by the CPU and the DSP.

* * * * *